(12) United States Patent
Lee et al.

(10) Patent No.: US 9,087,833 B2
(45) Date of Patent: Jul. 21, 2015

(54) POWER SEMICONDUCTOR DEVICES

(71) Applicant: Samsung Electronics Co., Ltd., Suwon-Si, Gyeonggi-Do (KR)

(72) Inventors: Baik-woo Lee, Gwangmyeong-si (KR); Seong-woon Booh, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/093,126

(22) Filed: Nov. 29, 2013

(65) Prior Publication Data

US 2014/0151744 A1 Jun. 5, 2014

(30) Foreign Application Priority Data

Nov. 30, 2012 (KR) .................. 10-2012-0138513
Mar. 7, 2013 (KR) .................. 10-2013-0024545

(51) Int. Cl.
*H01L 29/45* (2006.01)
*H01L 29/78* (2006.01)
(Continued)

(52) U.S. Cl.
CPC ...... *H01L 23/49844* (2013.01); *H01L 23/3735* (2013.01); *H01L 24/03* (2013.01); *H01L 24/05* (2013.01); *H01L 24/29* (2013.01); *H01L 24/48* (2013.01); *H01L 24/73* (2013.01); *H01L 25/072* (2013.01); *H01L 25/18* (2013.01); *H01L 24/45* (2013.01); *H01L 24/83* (2013.01); *H01L 24/85* (2013.01); *H01L 24/92* (2013.01); *H01L 29/2003* (2013.01); *H01L 29/7393* (2013.01); *H01L 2224/0345* (2013.01); *H01L 2224/03436* (2013.01); *H01L 2224/03452* (2013.01); *H01L 2224/04026* (2013.01); *H01L 2224/04042* (2013.01); *H01L 2224/0517* (2013.01); *H01L 2224/0518* (2013.01); *H01L 2224/05109* (2013.01); *H01L 2224/05111* (2013.01); *H01L 2224/05113* (2013.01);
(Continued)

(58) Field of Classification Search
CPC ...... H01L 29/45; H01L 29/78; H01L 29/7393
USPC .................................. 257/144, 288, 762
See application file for complete search history.

(56) References Cited

U.S. PATENT DOCUMENTS 7,326,640 B2   2/2008   Aoh et al.
7,851,913 B2   12/2010  Gutt et al.
(Continued)

FOREIGN PATENT DOCUMENTS

JP   H11-163045 A    6/1999
JP   2003-229527 A   8/2003
(Continued)

OTHER PUBLICATIONS

Novel Cu-bond contacts on sintered metal buffer for power module with extended capabilities, PCIM Europe 2012, May 8-10, 2012, Nuremberg, pp. 784-791.

*Primary Examiner* — Walter H Swanson
(74) *Attorney, Agent, or Firm* — Harness, Dickey & Pierce, PLC

(57) ABSTRACT

A power semiconductor device may comprise: a lower structure; a solder layer on the lower structure; a semiconductor structure on the solder layer; a contact layer on the semiconductor structure; a pad layer on the contact layer; and/or a wire between the pad layer and the lower structure. The solder layer may be electrically connected to a first electrode of the semiconductor structure.

14 Claims, 7 Drawing Sheets

(51) Int. Cl.
*H01L 29/739* (2006.01)
*H01L 23/498* (2006.01)
*H01L 23/373* (2006.01)
*H01L 23/00* (2006.01)
*H01L 25/07* (2006.01)
*H01L 25/18* (2006.01)
H01L 29/20 (2006.01)

(52) U.S. Cl.
CPC ............ *H01L 2224/05116* (2013.01); *H01L 2224/05117* (2013.01); *H01L 2224/05118* (2013.01); *H01L 2224/05124* (2013.01); *H01L 2224/05138* (2013.01); *H01L 2224/05139* (2013.01); *H01L 2224/05144* (2013.01); *H01L 2224/05147* (2013.01); *H01L 2224/05149* (2013.01); *H01L 2224/05155* (2013.01); *H01L 2224/05157* (2013.01); *H01L 2224/05163* (2013.01); *H01L 2224/05164* (2013.01); *H01L 2224/05166* (2013.01); *H01L 2224/05169* (2013.01); *H01L 2224/05173* (2013.01); *H01L 2224/05176* (2013.01); *H01L 2224/05181* (2013.01); *H01L 2224/05183* (2013.01); *H01L 2224/05184* (2013.01); *H01L 2224/05559* (2013.01); *H01L 2224/05644* (2013.01); *H01L 2224/05647* (2013.01); *H01L 2224/05655* (2013.01); *H01L 2224/05664* (2013.01); *H01L 2224/0603* (2013.01); *H01L 2224/29109* (2013.01); *H01L 2224/29111* (2013.01); *H01L 2224/29113* (2013.01); *H01L 2224/29116* (2013.01); *H01L 2224/29118* (2013.01); *H01L 2224/29139* (2013.01); *H01L 2224/29144* (2013.01); *H01L 2224/29147* (2013.01); *H01L 2224/29339* (2013.01); *H01L 2224/29347* (2013.01); *H01L 2224/45015* (2013.01); *H01L 2224/45147* (2013.01); *H01L 2224/48139* (2013.01); *H01L 2224/48227* (2013.01); *H01L 2224/48472* (2013.01); *H01L 2224/8384* (2013.01); *H01L 2224/83203* (2013.01); *H01L 2224/83801* (2013.01); *H01L 2224/8584* (2013.01); *H01L 2224/85205* (2013.01); *H01L 2224/85801* (2013.01); *H01L 2224/92247* (2013.01); *H01L 2924/1305* (2013.01); *H01L 2924/1306* (2013.01); *H01L 2924/13033* (2013.01); *H01L 2924/13055* (2013.01); *H01L 2924/13091* (2013.01)

(56) References Cited

U.S. PATENT DOCUMENTS

| | | | |
|---|---|---|---|
| 7,911,061 | B2 | 3/2011 | Schneegans et al. |
| 2009/0008796 | A1 | 1/2009 | Eng et al. |
| 2010/0127371 | A1* | 5/2010 | Tschirbs ............... 257/684 |
| 2010/0181675 | A1 | 7/2010 | Reynoso et al. |
| 2011/0070695 | A1 | 3/2011 | Bayerer |
| 2011/0121458 | A1 | 5/2011 | Siepe et al. |
| 2013/0161801 | A1* | 6/2013 | Otremba et al. ........... 257/668 |

FOREIGN PATENT DOCUMENTS

| | | |
|---|---|---|
| JP | 2012-074726 A | 4/2012 |
| JP | 2012-079914 A | 4/2012 |
| KR | 10-2012-0078391 A | 1/2014 |

* cited by examiner

POWER SEMICONDUCTOR DEVICES

CROSS-REFERENCE TO RELATED APPLICATION(S)

This application claims priority from Korean Patent Application No. 10-2012-0138513, filed on Nov. 30, 2012, in the Korean Intellectual Property Office (KIPO), and Korean Patent Application No. 10-2013-0024545, filed on Mar. 7, 2013, in the KIPO, the entire contents of both of which are incorporated herein in by reference.

BACKGROUND

1. Field

Some example embodiments may relate generally to methods and/or apparatuses for forming nano dot structures on silicon oxide. Some example embodiments may relate to nano dot structures that have regular array shapes and/or are formed by controlling positions thereof on silicon oxide and/or methods of manufacturing the nano dot structures.

2. Description of Related Art

Power semiconductor elements to deal with relatively large power ranging from several hundreds of kilowatts (KW) to several megawatts (MW) have been generally used in inverter circuits, power units for large capacity servers, and uninterruptible power supply sources for industrial motors or automobile motors. A power semiconductor element includes a semiconductor switch, for example, a metal-oxide semiconductor field-effect transistor (MOSFET), an insulated gate bipolar transistor (IGBT), etc.

The power semiconductor element is assembled in a package structure that performs essential functions such as protection from an external environment, connection to an external electrode, etc. In particular, in the case of a switch power device such as a power module, packaging technologies to reduce an internal impedance, restrict the influence of an electronic field due to an internal electrode, provide an optimal insulation function, extend the life span, and reduce the manufacturing costs are needed.

The functions of the power semiconductor element may be accurately performed only when it is electrically connected to an external system. In this regard, a bonding technology such as wire bonding and/or soldering is used to electrically connect the power semiconductor element to the external system. One of the major factors in the bonding technology is a feature of an electrode formed in the power semiconductor element.

SUMMARY

Some example embodiments may provide power semiconductor devices having structure in which gates of the power semiconductor elements are electrically connected to a solder layer when the power semiconductor element is electrically connected to an external system.

In some example embodiments, a power semiconductor device may comprise: a lower structure; a solder layer on the lower structure; a semiconductor structure on the solder layer; a contact layer on the semiconductor structure; a pad layer on the contact layer; and/or a wire between the pad layer and the lower structure. The solder layer may be electrically connected to a first electrode of the semiconductor structure.

In some example embodiments, the lower structure may comprise a copper pattern layer electrically connected to the first electrode via the solder layer.

In some example embodiments, the lower structure may comprise: a copper pattern layer; a copper layer; and/or a ceramic layer between the copper pattern layer and the copper layer.

In some example embodiments, the semiconductor structure may comprise: the first electrode and a second electrode on a first surface of the semiconductor structure; and/or a third electrode on a second surface of the semiconductor structure.

In some example embodiments, the semiconductor structure may be an insulated gate bipolar transistor (IGBT) structure. The first electrode may be a gate. The second electrode may be an emitter. The third electrode may be a collector. The gate and the emitter may be electrically connected to the solder layer.

In some example embodiments, the collector may be electrically connected to the pad layer.

In some example embodiments, the semiconductor structure may be a metal-oxide semiconductor field-effect transistor (MOSFET) structure. The first electrode may be a gate. The second electrode may be a source. The third electrode may be a drain. The gate and the source may be electrically connected to the solder layer.

In some example embodiments, the drain may be electrically connected to the pad layer.

In some example embodiments, the power semiconductor device may further comprise: a trench in a boundary region between the pad layer and the contact layer.

In some example embodiments, the solder layer may comprise a first solder layer and a second solder layer on the lower structure. The semiconductor structure may be on the first solder layer. A diode structure may be on the second solder layer. The contact layer and the pad layer may be on each of the semiconductor structure and the diode structure. Each of the pad layers may be electrically connected to the lower structure via the wire.

In some example embodiments, the semiconductor structure may comprise an insulated gate bipolar transistor (IGBT) or a metal-oxide semiconductor field-effect transistor (MOSFET).

In some example embodiments, the diode structure may comprise: an anode; a diode material layer; and/or a cathode.

In some example embodiments, the diode structure may be electrically connected to the lower structure via the second solder layer.

In some example embodiments, the power semiconductor device may further comprise: a trench in a boundary region between the pad layer and the contact layer.

In some example embodiments, the contact layer may be formed of a same material as the solder layer.

In some example embodiments, the ceramic layer may be formed of $Al_2O_3$ or AlN.

The pad layer may be nickel (Ni) or copper (Cu).

The pad layer may have a multilayer structure and comprise a first pad layer and a second pad layer that are formed of Ni.

The second pad layer may be formed of gold (Au) or palladium (Pd).

The first pad layer may have a structure of Cu/Ni or Ni/Cu/Ni.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1A:
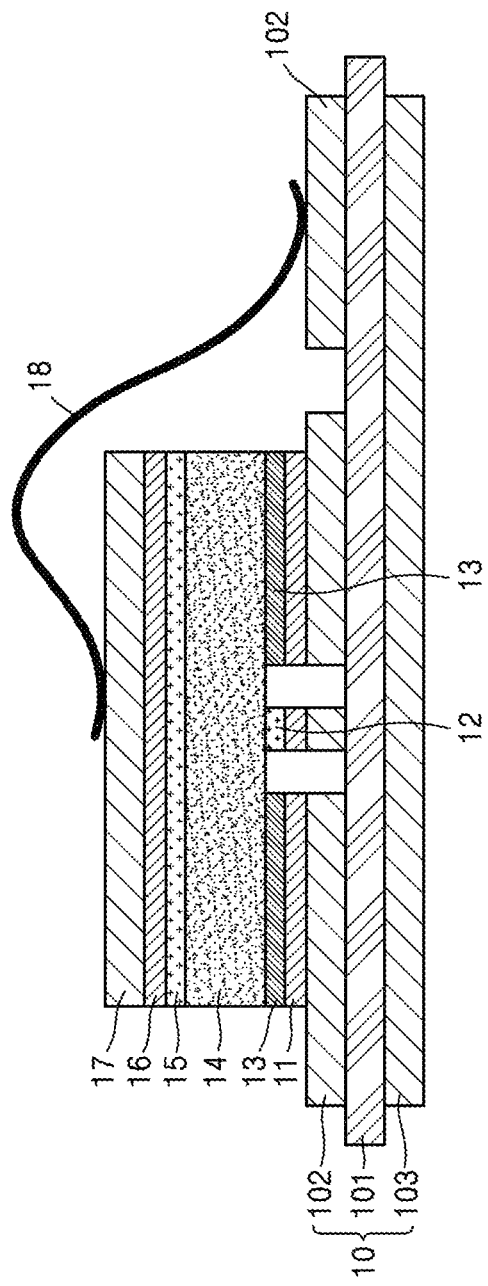
FIG. 1A is a cross-sectional view schematically illustrating a structure of a power semiconductor device according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1A is a cross-sectional view schematically illustrating a structure of a power semiconductor device according to some example embodiments. Referring to FIG. 1A, the power semiconductor device according to some example embodiments may include a lower structure 10, semiconductor structures 12, 13, 14, and 15 formed on the lower structure 10, a contact layer 16 formed on the semiconductor structures 12, 13, 14, and 15, and a pad layer 17 formed on the contact layer 16. The pad layer 17 is electrically connected to the lower structure 10 via a wire 18. A solder layer 11 may be further formed between the lower structure 10 and the semiconductor structures 12, 13, 14, and 15.

The lower structure 10 may be a substrate used for a power semiconductor element. For example, the lower structure 10 may be a direct bonded copper (DBC) substrate including a copper pattern layer 102 connected to a desired circuit element (that may or may not be predetermined). The DBC substrate may include the copper pattern layer 102, a copper layer 103, and a ceramic layer 101 formed between the copper pattern layer 102 and the copper layer 103. The copper pattern layer 102 may be electrically connected to each of electrode elements of the semiconductor structures 12, 13, 14, and 15. The ceramic layer 101 may be formed of ceramic such as $Al_2O_3$ (where 'Al' stands for aluminum and 'O' stands for oxygen), AlN (where 'N' stands for nitrogen), etc., for electrical insulation. The DBC substrate may supply electrical power to the power semiconductor element including the semiconductor structures 12, 13, 14, and 15 and also dissipate heat generated in the power semiconductor element to the outside by providing a heat dissipation path.

The semiconductor structures 12, 13, 14, and 15 may include a first electrode 12 and a second electrode 13 formed on a first surface of a semiconductor layer 14, and a third electrode 15 formed on a second surface of the semiconductor layer 14. For example, the first surface of the semiconductor layer 14 may be a lower surface of the semiconductor layer 14. The first and second electrodes 12 and 13 are electrically separated from each other and may be formed between the solder layer 11 and the semiconductor layer 14. The second surface of the semiconductor layer 14 may be an upper surface of the semiconductor layer 14. The third electrode 15 may be formed between the semiconductor layer 14 and the pad layer 17.

The semiconductor structures 12, 13, 14, and 15 may be a high power semiconductor structure, that is, a power device, through which a current of several amperes (A) to several kiloamperes (kA) may flow. The semiconductor structures 12, 13, 14, and 15 may be semiconductor structures for an insulated-gate bipolar transistor (IGBT), a metal-oxide-semiconductor field-effect transistor (MOSFET), or a triac. However, this is a mere example and the semiconductor structures 12, 13, 14, and 15 may be lower power semiconductor structures, but example embodiments are not limited thereto.

For example, the semiconductor structures 12, 13, 14, and 15 may be IGBT structures, in which the first electrode 12 may be a gate, the second electrode 13 may be an emitter, and the third electrode 15 may be a collector. The semiconductor structures 12, 13, 14, and 15 may also be MOSFET structures, in which the first electrode 12 may be a gate, the second electrode 13 may be a source, and the third electrode 15 may be a drain. The semiconductor layer 14 may be selected according to the type of a semiconductor element. For example, in the case of a power device, the semiconductor layer 14 may have a multilayer structure including a channel layer and a channel supply layer. The channel layer may include at least one of various materials such as GaN (where 'Ga.' stands for gallium), InGaN, or AlGa. The channel supply layer may include at least one of various materials such as AlGaN, AlInN, InGaN, AlN, or AlInGaN.

In the power semiconductor device according to some example embodiments, since the first and second electrodes 12 and 13 are formed on the first surface, that is, the lower surface of the semiconductor layer 14, the first surface of the semiconductor layer 14 has a relatively complicated structure compared to the second surface, that is, the upper surface of the semiconductor layer 14 on which the third electrode 15 is formed. Accordingly, when wire bonding is formed in an area where the first and second electrodes 12 and 13 are formed, a process of forming a bonding pad and a wire bonding process need to be more accurate. Thus, in the power semiconductor device according to some example embodiments, while the first and second electrodes 12 and 13 of the semiconductor structures 12, 13, 14, and 15 are connected to the solder layer 11 on the lower structure 10, the third electrode 15 may be electrically connected to the wire 18. The first, second, and third electrodes 12, 13, and 15 may be formed of a conductive material such as metal, a metal alloy, a conductive metal oxide or nitride.

As described above, the solder layer 11 may be further formed between the lower structure 10 and the first and second electrodes 12 and 13 of the semiconductor structures 12, 13, 14, and 15. The solder layer 11 may be formed to facilitate bonding between the first and second electrodes 12 and 13 and the lower structure 10, and may be formed of a conductive material such as metal in a multilayer or monolayer structure. The solder layer 11 may be formed by soldering or sintering. The solder layer 11 may be formed including at least one of materials such as tin (Sn), copper (Cu), silver (Ag), gold (Au) zinc (Zn), lead (Pb), bismuth (Bi), or indium (In). In the sintering, a silver paste or Cu paste including nano- or micro-sized particles is processed by a pressing and heating process. A space between the first electrode 12 and the second electrode 13 may be empty or selectively filled with an insulation material to improve an electrical insulation feature.

The contact layer 16 is formed to be connected between the pad layer 17 and the third electrode 15 of the semiconductor structures 12, 13, 14, and 15. The contact layer 16 may be formed of, for example, at least one of tin (Sn), aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr). Alternatively, the contact layer 16 may be formed of the same material as the solder layer 11.

The pad layer 17 may be formed to be bonded with the wire 18 by soldering or sintering. The pad layer 17 may prevent damages of the semiconductor structures 12, 13, 14, and 15 due to pressure applied thereto during bonding and also prevent dispersion of a material of the wire 18 into the semiconductor structures 12, 13, 14, and 15.

The wire 18 may be formed of copper (Cu) and have a diameter of about 100 micrometers or more. The wire 18 may be connected between the lower structure 10 and the pad layer 17 of the semiconductor structures 12, 13, 14, and 15 by ultrasound wedge bonding.

The pad layer 17 of FIG. 1A may include a material having strength and rigidity greater than Al. For example, the pad layer 17 may include at least one of materials such as nickel (Ni) or copper (Cu) and may be formed in a monolayer or multilayer structure. FIGS. 3A to 3D are cross-sectional views illustrating various structures of a pad region of a power semiconductor device according to some example embodiments.

Figure 3A:
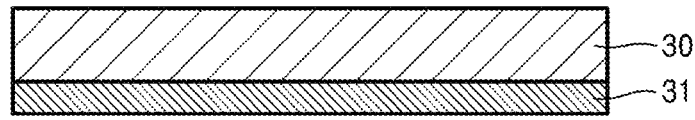
FIGS. 3A to 3D are cross-sectional views illustrating various structures of a pad region of a power semiconductor device according to some example embodiments.
Figure 3B:
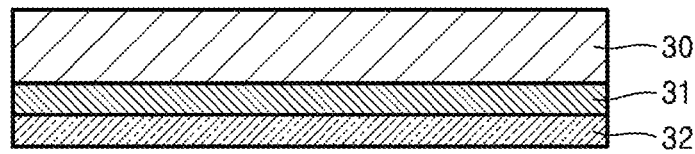
Figure 3C:
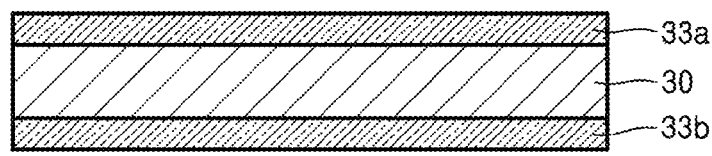
Figure 3D:
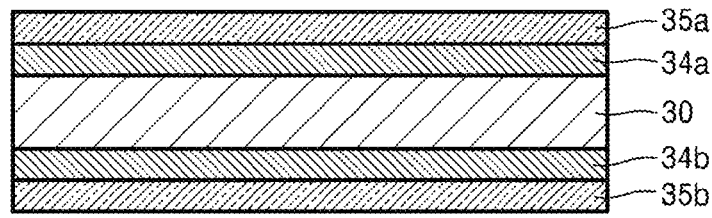

As illustrated in FIG. 3A, the pad layer 17 may have a dual layer structure of a first pad layer 30 and a second pad layer 31. The first pad layer 30 may be formed of Ni and the second pad layer 31 may be formed of Au or Pd. As illustrated in FIG. 3B, the pad layer 17 may have a triple layer structure of the first pad layer 30 formed of Ni, the second pad layer 31 formed of Pd, and a third pad layer 32 formed of Au. Also, as illustrated in FIG. 3C, the pad layer 17 may have a triple layer structure in which fourth pad layers 33a and 33b formed of Au or Pd are respectively arranged at opposite sides of the first pad layer 30 that is formed of Ni. As illustrated in FIG. 3D, the pad layer 17 may include fifth pad layers 34a and 34b formed of Pd that are respectively arranged at the opposite sides of the first pad layer 30 formed of Ni, and sixth pad layers 35a and 35b formed of Au that are respectively arranged on outer sides of the fifth pad layers 34a and 34b. In addition, the first pad layer 30 of FIGS. 3A to 3D may have a multilayered structure of Cu/Ni or Ni/Cu/Ni.

Figure 1B:
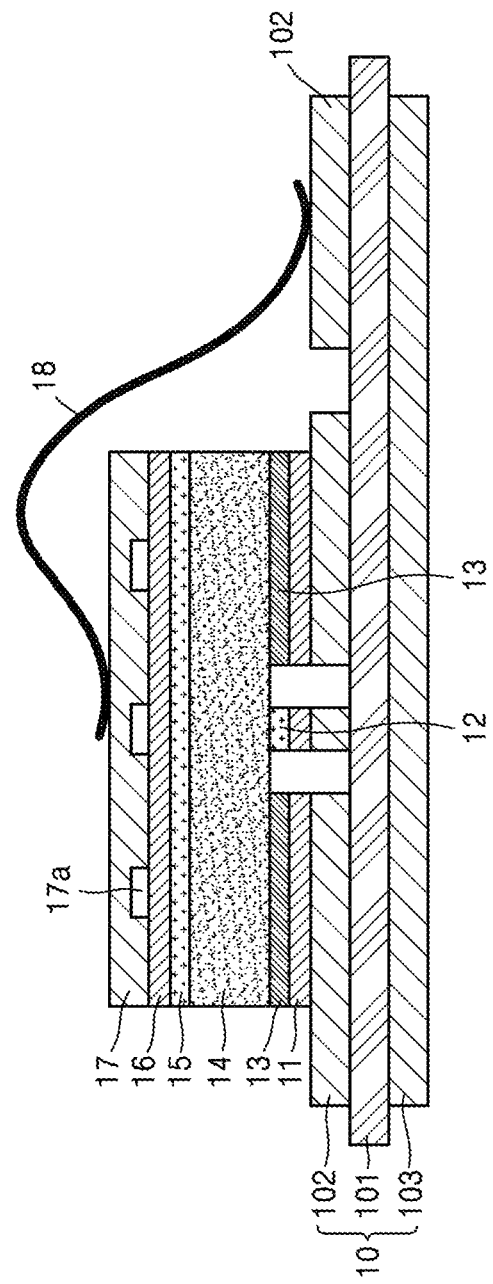
FIG. 1B is a cross-sectional view schematically illustrating a structure in which a trench is formed between the contact layer and the pad layer of the power semiconductor device of FIG. 1A.

A pad layer of the power semiconductor device according to some example embodiments may further include a trench region. FIG. 1B is a cross-sectional view schematically illustrating a structure in which a trench is formed between the contact layer 16 and the pad layer 17 of the power semiconductor device of FIG. 1A.

Referring to FIG. 1B, the power semiconductor device may include the lower structure 10, the semiconductor structures 12, 13, 14, and 15 formed on the lower structure 10, the contact layer 16 formed on the semiconductor structures 12, 13, 14, and 15, and the pad layer 17 formed on the contact layer 16. The pad layer 17 may be electrically connected to the lower structure 10 via the wire 18. The solder layer 11 may be further formed between the lower structure 10 and the semiconductor structures 12, 13, 14, and 15. A trench 17a may be formed between the contact layer 16 and the pad layer 17. The trench 17a may be formed in a boundary region between the pad layer 17 and the contact layer 16. The trench 17a may be formed into the pad layer 17 from the boundary region between the pad layer 17 and the contact layer 16. Alternatively, the trench 17a may be formed into the contact layer 16 from the boundary region between the pad layer 17 and the contact layer 16. The trench 17a may be a void region that is an empty space without a filling material.

As the trench 17a is formed between the contact layer 16 and the pad layer 17, reliability of the power semiconductor device according to some example embodiments may be secured. The contact layer 16 and the pad layer 17 may be formed of different materials. As the power semiconductor device according to some example embodiments is used in different temperature environments, a difference in a thermal expansion coefficient according to a temperature between the materials of the contact layer 16 and the pad layer 17 occurs, and thus, a separation phenomenon may be generated at a boundary surface between the contact layer 16 and the pad layer 17. To prevent such a phenomenon, the trench 17a is formed on the boundary surface between the contact layer 16 and the pad layer 17, thereby securing the reliability of the power semiconductor device.

Figure 2A:
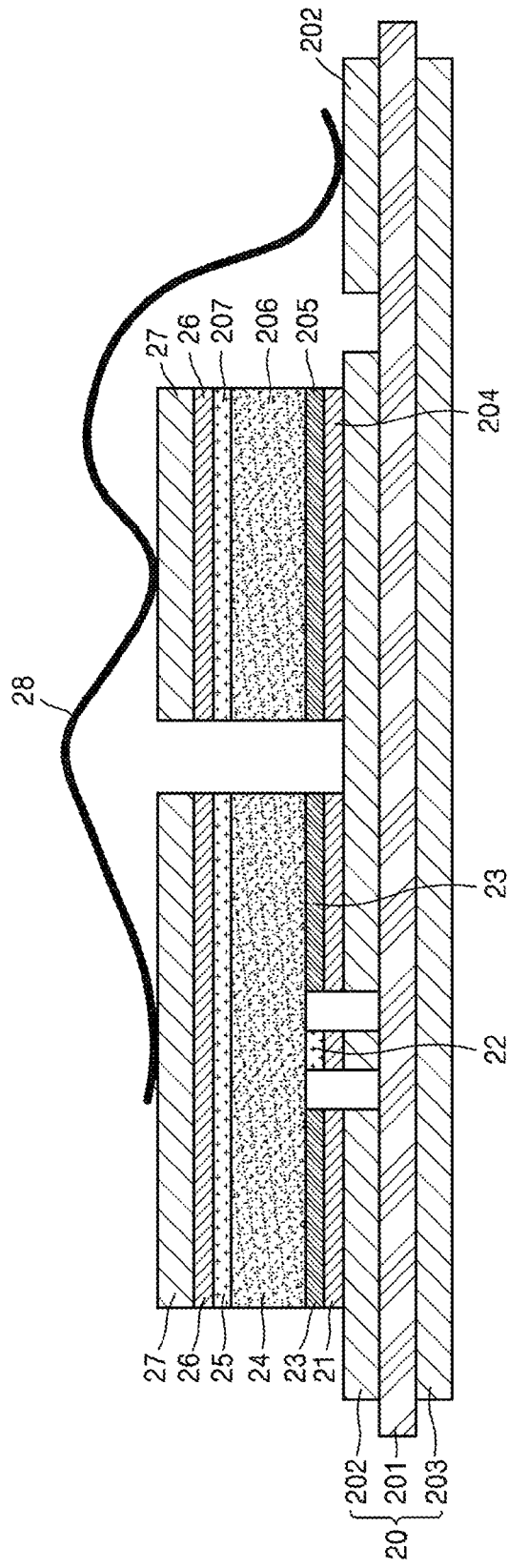
FIG. 2A is a cross-sectional view schematically illustrating a power semiconductor device having the structure of FIG. 1A that additionally includes a diode region.

The power semiconductor device according to some example embodiments may further include a diode region. FIG. 2A is a cross-sectional view schematically illustrating a power semiconductor device having the structure of FIG. 1A which further includes a diode region.

Referring to FIG. 2A, the power semiconductor device according to some example embodiments may include a lower structure 20 and a first solder layer 21 and a second solder layer 204 formed on the lower structure 20. Semiconductor structures 22, 23, 24, and 25 may be formed on the first solder layer 21. Diode structures 205, 206, and 207 may be formed on the second solder layer 204. A contact layer 26 and a pad layer 27 are formed on each of the semiconductor structures 22, 23, 24, and 25 and the diode structures 205, 206, and 207. The pad layer 27 may be electrically connected to the lower structure 20 via a wire 28. Constituent elements having the same names as those of the power semiconductor elements of FIG. 1A and FIG. 2A may be formed of the same materials.

The lower structure 20 may be a substrate used for a power semiconductor element. For example, the lower structure 20 may be a DBC substrate including a copper pattern layer 202 connected to a desired circuit element (that may or may not be predetermined). The DBC substrate may include the copper pattern layer 202, a copper layer 203, and a ceramic layer 201 formed between the copper pattern layer 202 and the copper layer 203.

Each of the semiconductor structures 22, 23, 24, and 25 may be a high power semiconductor structure, that is, a power device. The semiconductor structures 22, 23, 24, and 25 may be a semiconductor structure for an IGBT, a MOSFET, or a triac. The descriptions about the semiconductor structures 12, 13, 14, and 15 of FIG. 1A may be applied to the semiconductor structures 22, 23, 24, and 25.

The diode structures 205, 206, and 207 may include an anode 205, a diode material layer 206, and a cathode 207. The anode 205 and the cathode 207 may be formed of metal, a metal alloy, a conductive metal oxide, or a conductive metal nitride. The diode material layer 206 may be a p-n junction region and may include a p-type semiconductor material layer and an n-type semiconductor material or a p-type oxide layer and an n-type oxide layer. The anode 205 may be electrically connected to the lower structure 20 via the second solder layer 204. The cathode 207 may be electrically connected to the lower structure 20 via the wire 28.

Figure 2B:
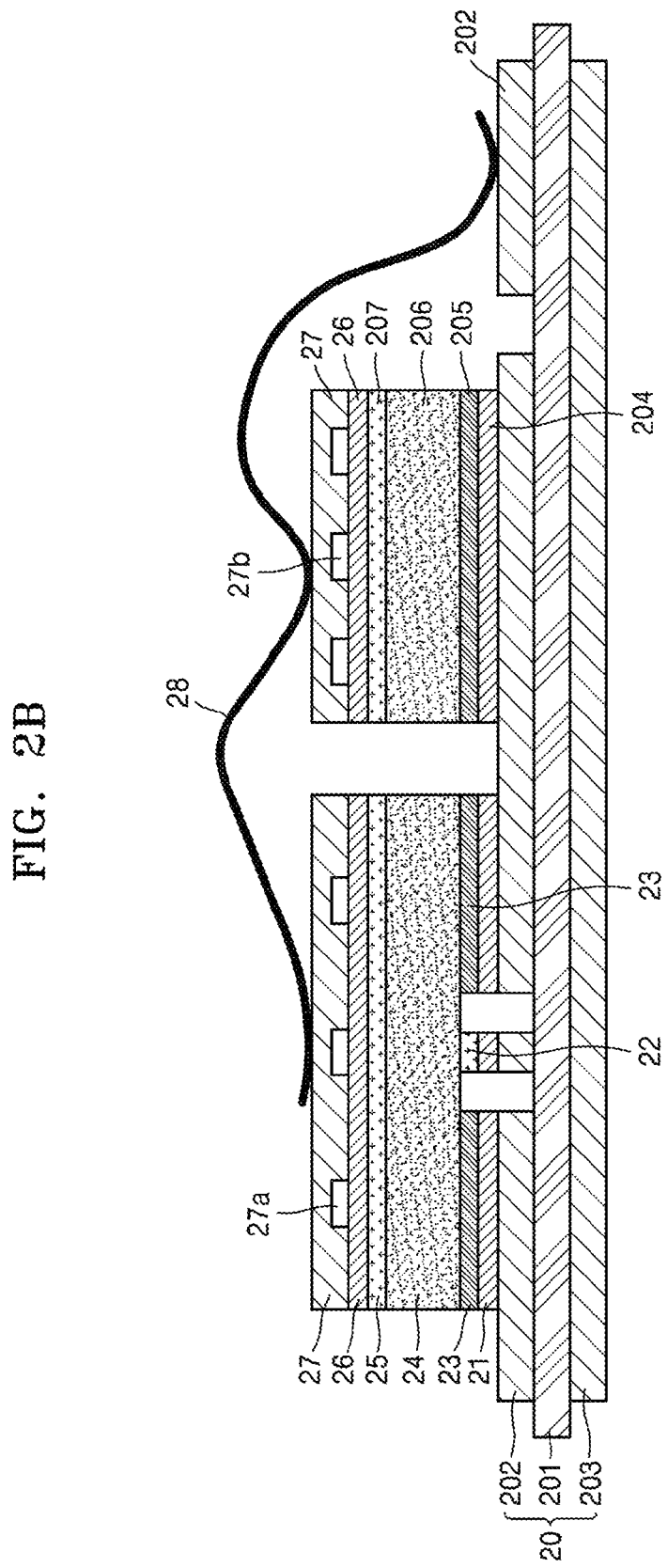
FIG. 2B is a cross-sectional view schematically illustrating a structure in which a trench is formed between the contact layer and the pad layer of the power semiconductor device of FIG. 2A.

FIG. 2B is a cross-sectional view schematically illustrating a structure in which a trench is formed between the contact layer 26 and the pad layer 27 of the power semiconductor device of FIG. 2A. Referring to FIG. 2B, a first trench 27a may be formed between the contact layer 26 and the pad layer 27 on the semiconductor structures 22, 23, 24, and 25. The first trench 27a and a second trench 27b may be formed between the contact layer 26 and the pad layer 27 on the diode structures 205, 206, and 207.

The first trench 27a and the second trench 27b may be formed into the pad layer 27 from a boundary region between the contact layer 26 and the pad layer 27. Alternatively, the first trench 27a and the second trench 27b may be formed into the contact layer 26 from the boundary region between the contact layer 26 and the pad layer 27. The first trench 27a and the second trench 27b may be void regions that are empty spaces without a filling material. As the first trench 27a and the second trench 27b are formed between the contact layer 26 and the pad layer 27, reliability of the power semiconductor device according to some example embodiments may be secured.

The power semiconductor device according to some example embodiments may be formed by a variety of manufacturing methods. For example, the power semiconductor device according to some example embodiments may be formed by a deposition method such as a physical vapor deposition (PVD) method, a plasma enhanced chemical vapor deposition CVD (PECVD) method, a low pressure CVD (LPCVD), a sputtering method, an atomic layer deposition (ALD). However, example embodiments are not limited thereto.

Figure 4A:
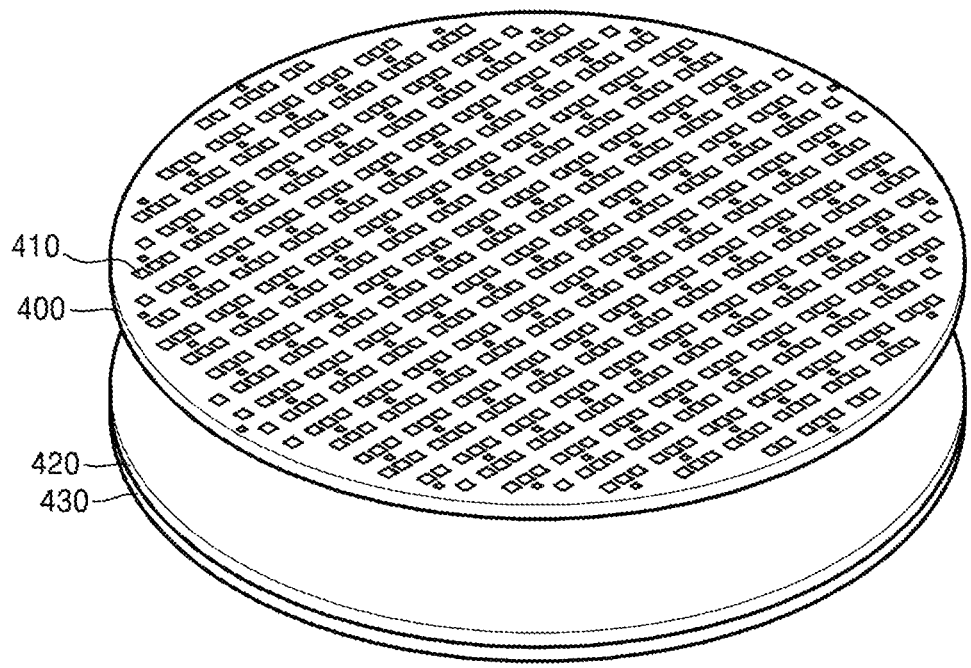
FIGS. 4A to 4D illustrate examples of manufacturing of a power semiconductor device on a wafer level, according to some example embodiments.
Figure 4B:
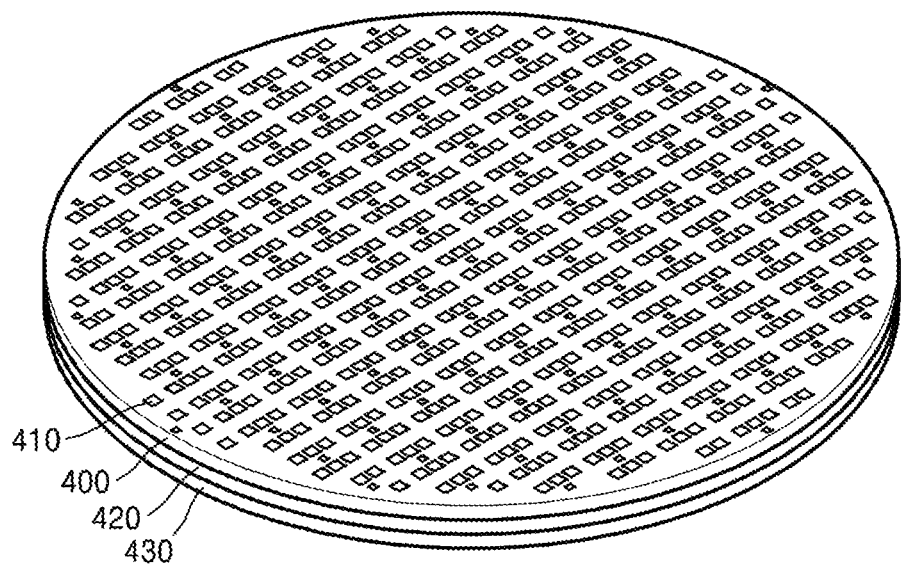

FIGS. 4A to 4D illustrate examples of manufacturing of a power semiconductor device on a wafer level, according to some example embodiments. Referring to FIG. 4A, a process of forming a power semiconductor array 400 such as an IGBT, a MOSFET, or a diode device on an edge surface of a wafer level is performed. An upper surface of the power semiconductor array 400 may be a first surface 410 where a gate, an emitter, or an anode is formed. A process of forming a pad layer 430 and a contact layer 420 is performed. Next, as illustrated in FIG. 4B, the power semiconductor array 400 and the contact layer 420 are bonded to each other. In doing so, soldering or sintering may be performed or a variety of processing methods such as deposition, printing, plating, or dispensing, but example embodiments are not limited thereto.

Figure 4C:
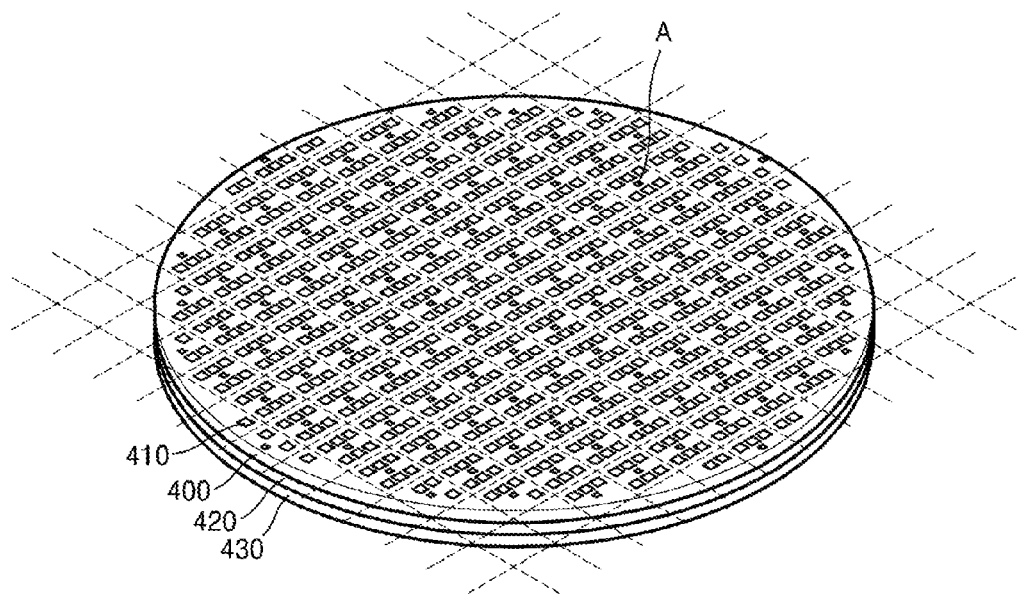
Figure 4D:
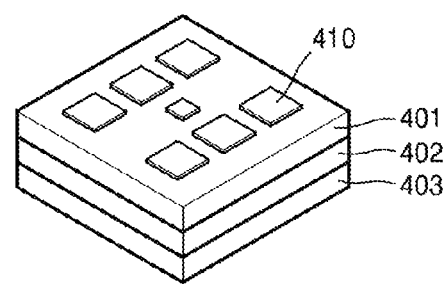

Also, as illustrated in FIG. 4C, the bonded layers are separated into individual power semiconductor elements in units of an area A by a dicing/sawing process. As a result, an individual device including the pad layer 403, the contact layer 402, and the power semiconductor element 401 may be obtained as illustrated in FIG. 4D. The individual device is attached to a lower structure such as a DBC and a wire bonding process is performed, thereby completing the forming of the power semiconductor device according to some example embodiments. According to the above process, manufacturing costs may be reduced and the processes may be integrated.

As described above, the power semiconductor device according to some example embodiments includes a power semiconductor element formed on a lower structure, an electrode on a lower surface of the power semiconductor element is electrically connected to a solder layer, and an upper electrode is electrically connected to a wire via a pad layer, and thus, process costs may be reduced and processes may be integrated. Also, a trench region is formed on a boundary surface between a contact layer and a pad layer of the power semiconductor device and, thus, reliability of the power semiconductor device may be secured.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A power semiconductor device, comprising:
   a lower structure;
   a solder layer on the lower structure;
   a semiconductor structure on the solder layer;
   a contact layer on the semiconductor structure;
   a pad layer on the contact layer;
   a wire between the pad layer and the lower structure; and
   a trench in a boundary region between the pad layer and the contact layer;
   wherein the solder layer is electrically connected to a first electrode of the semiconductor structure.

2. The power semiconductor device of claim 1, wherein the lower structure comprises a copper pattern layer electrically connected to the first electrode via the solder layer.

3. The power semiconductor device of claim 1, wherein the lower structure comprises:
   a copper pattern layer;
   a copper layer; and
   a ceramic layer between the copper pattern layer and the copper layer.

4. The power semiconductor device of claim 1, wherein the semiconductor structure comprises:
   the first electrode and a second electrode on a first surface of the semiconductor structure; and
   a third electrode on a second surface of the semiconductor structure.

5. The power semiconductor device of claim 4, wherein the semiconductor structure is an insulated gate bipolar transistor (IGBT) structure,
   wherein the first electrode is a gate,
   wherein the second electrode is an emitter,
   wherein the third electrode is a collector, and
   wherein the gate and the emitter are electrically connected to the solder layer.

6. The power semiconductor device of claim 5, wherein the collector is electrically connected to the pad layer.

7. The power semiconductor device of claim 4, wherein the semiconductor structure is a metal-oxide semiconductor field-effect transistor (MOSFET) structure,
   wherein the first electrode is a gate,
   wherein the second electrode is a source,
   wherein the third electrode is a drain, and
   wherein the gate and the source are electrically connected to the solder layer.

8. The power semiconductor device of claim 7, wherein the drain is electrically connected to the pad layer.

9. A power semiconductor device, comprising:
   a lower structure;
   a solder layer on the lower structure;
   a semiconductor structure on the solder layer;
   a contact layer on the semiconductor structure;
   a pad layer on the contact layer; and
   a wire between the pad layer and the lower structure;
   wherein the solder layer is electrically connected to a first electrode of the semiconductor structure,
   wherein the solder layer comprises a first solder layer and a second solder layer on the lower structure,
   wherein the semiconductor structure is on the first solder layer,
   wherein a diode structure is on the second solder layer,
   wherein the contact layer and the pad layer are on each of the semiconductor structure and the diode structure, and
   wherein the pad layer is electrically connected to the lower structure via the wire.

10. The power semiconductor device of claim 9, wherein the semiconductor structure comprises an insulated gate bipolar transistor (IGBT) or a metal-oxide semiconductor field-effect transistor (MOSFET).

11. The power semiconductor device of claim 9, wherein the diode structure comprises:
    an anode;
    a diode material layer; and
    a cathode.

12. The power semiconductor device of claim 11, wherein the diode structure is electrically connected to the lower structure via the second solder layer.

13. The power semiconductor device of claim 9, further comprising:
    a trench in a boundary region between the pad layer and the contact layer.

14. The power semiconductor device of claim 1, wherein the contact layer is formed of a same material as the solder layer.

* * * * *